US012791612B2

(12) United States Patent
Suzuki et al.

(10) Patent No.: US 12,791,612 B2
(45) Date of Patent: Nov. 10, 2026

(54) MEASUREMENT DEVICE

(71) Applicant: SONY SEMICONDUCTOR SOLUTIONS CORPORATION, Kanagawa (JP)

(72) Inventors: Norihito Suzuki, Kanagawa (JP); Hiroaki Fujita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 172 days.

(21) Appl. No.: 18/848,640

(22) PCT Filed: Mar. 28, 2022

(86) PCT No.: PCT/JP2022/014813
§ 371 (c)(1),
(2) Date: Sep. 19, 2024

(87) PCT Pub. No.: WO2023/187856
PCT Pub. Date: Oct. 5, 2023

(65) Prior Publication Data
US 2026/0266901 A1 Sep. 10, 2026

(51) Int. Cl.
*G01R 31/317* (2006.01)

(52) U.S. Cl.
CPC .............................. *G01R 31/31705* (2013.01)

(58) Field of Classification Search
CPC ................................................ G01R 31/31705
See application file for complete search history.

(56) References Cited

U.S. PATENT DOCUMENTS

2004/0156450 A1* 8/2004 Auranen ................ H03D 3/009 375/324
2013/0051481 A1* 2/2013 Tsuchida ................ H04H 40/90 375/257
(Continued)

FOREIGN PATENT DOCUMENTS

| | | | |
|---|---|---|---|
| CN | 110113067 | A | 8/2019 |
| JP | 03-035174 | A | 2/1991 |
| JP | 2008-232807 | A | 10/2008 |

(Continued)

OTHER PUBLICATIONS

International Search Report and Written Opinion of PCT Application No. PCT/JP2022/014813, issued on Jun. 7, 2022, 10 pages of ISRWO.

*Primary Examiner* — Paresh Patel
(74) *Attorney, Agent, or Firm* — CHIP LAW GROUP

(57) ABSTRACT

The present disclosure relates to a measurement device capable of taking measurements more accurately.
A measurement device is provided, the measurement device including: a PLL circuit used in common to generate both a transmission RF signal and a reception LO signal that are high-frequency signals at different frequencies; an IQ correction unit that corrects IQ error in an LO signal used to generate at least one of the transmission RF signal or the reception LO signal; and a switching unit that switches between an on state in which correction by the IQ correction unit is performed and an off state in which the correction is not performed. The present disclosure can be applied in a vector network analyzer, for example.

11 Claims, 20 Drawing Sheets

(56) References Cited

U.S. PATENT DOCUMENTS

| | | | | |
|---|---|---|---|---|
| 2015/0180418 | A1 * | 6/2015 | Maeda | H04L 25/03<br>375/297 |
| 2021/0119837 | A1 | 4/2021 | Huang et al. | |

FOREIGN PATENT DOCUMENTS

| | | | |
|---|---|---|---|
| JP | 2013-187817 | A | 9/2013 |
| JP | 2016-008972 | A | 1/2016 |
| JP | 2019-047424 | A | 3/2019 |
| JP | 2019-087843 | A | 6/2019 |

* cited by examiner

Fig. 3

| LO SIGNAL FREQUENCY | IQ CORRECTION UNIT |
| --- | --- |
| 3~9GHz | ON |
| 1~3GHz | OFF |

MEASUREMENT DEVICE

CROSS REFERENCE TO RELATED APPLICATIONS

This application is a U.S. National Phase of International Patent Application No. PCT/JP2022/014813 filed on Mar. 28, 2022. Each of the above-referenced applications is hereby incorporated herein by reference in its entirety.

TECHNICAL FIELD

The present disclosure relates to a measurement device, and particularly relates to a measurement device capable of taking measurements more accurately.

BACKGROUND ART

A vector network analyzer (VNA) is a device that measures radio frequency signals in the frequency domain. As a vector network analyzer configuration that generates transmission Radio Frequency (RF) signals and reception Local Oscillator (LO) signals, which are high-frequency signals at different frequencies, a configuration is known in which a single Phase Locked Loop (PLL) circuit is used in common to generate either of these signals through frequency transform by a mixer (see PTL 1, for example).

CITATION LIST

Patent Literature

PTL 1

JP H3-35174A

SUMMARY

Technical Problem

In a vector network analyzer configured using such a common PLL circuit, there is a risk that image signals will be affected by IQ error, and it is therefore necessary to suppress measurement error caused by image signals. However, with the conventional techniques, such measures have been insufficient, and there is thus demand for measurements to be taken more accurately.

Having been conceived in light of such circumstances, the present disclosure makes it possible to take measurements more accurately.

Solution to Problem

A measurement device according to one aspect of the present disclosure is a measurement device including: a PLL circuit used in common to generate both a transmission RF signal and a reception LO signal that are high-frequency signals at different frequencies; an IQ correction unit that corrects IQ error in an LO signal used to generate at least one of the transmission RF signal or the reception LO signal; and a switching unit that switches between an on state in which correction by the IQ correction unit is performed and an off state in which the correction is not performed.

In the measurement device according to one aspect of the present disclosure, the PLL circuit, which is used in common to generate both a transmission RF signal and a reception LO signal that are high-frequency signals at different frequencies, is provided; IQ error in an LO signal used to generate at least one of the transmission RF signal or the reception LO signal is corrected; and a switch is made between an on state in which the IQ error is corrected and an off state in which the IQ error is not corrected.

Note that the measurement device according to one aspect of the present disclosure may be a standalone device, or may be internal blocks constituting a single device.

BRIEF DESCRIPTION OF DRAWINGS

FIG. 3 is a diagram illustrating an example of switching an IQ correction unit on and off.

DESCRIPTION OF EMBODIMENTS

<Configuration of VNA>

Figure 1:
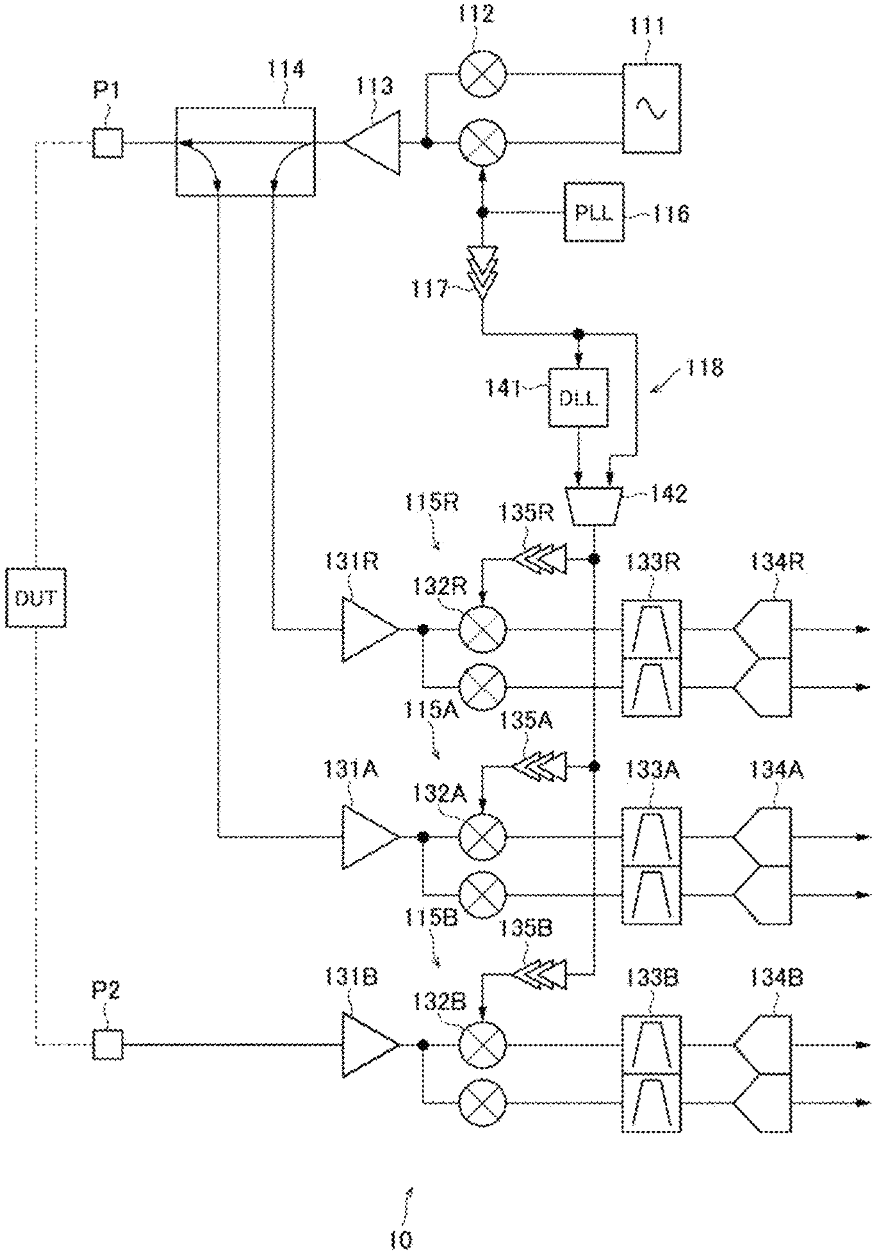
FIG. 1 is a diagram illustrating an example of the configuration of one embodiment of a measurement device to which the present disclosure is applied.

FIG. 1 is a diagram illustrating an example of the configuration of one embodiment of a measurement device to which the present disclosure is applied.

In FIG. 1, a measurement device 10 is a vector network analyzer (VNA) capable of measuring scattering parameters (S parameters), such as S11 and S21, of a measurement target DUT connected to a terminal P1 and a terminal P2.

As illustrated in FIG. 1, the measurement device 10 is constituted by an Intermediate Frequency (IF) signal generator 111, a transmission mixer 112, a transmission amplifier 113, a directional coupler 114, a receiver 115R, a receiver 115A, a receiver 115B, a PLL circuit 116, a buffer 117, and an IQ correction unit 118.

In the measurement device 10, a transmission IF signal from the IF signal generator 111 is frequency-converted by the transmission mixer 112, and as a result, a transmission RF signal is output to the terminal P1 from the transmission amplifier 113 via the directional coupler 114.

The transmission RF signal is measured by being received by the receiver 115R. However, part of the transmission RF signal is measured by the transmission RF signal being reflected by the measurement target DUT, and the reflected signal input from the terminal P1 and received by the receiver 115A via the directional coupler 114. Part of the transmission RF signal is measured by the transmission RF signal penetrating through the measurement target DUT, and the penetrating signal input from the terminal P2 and received by the receiver 115B.

The receiver 115R is constituted by a Low Noise Amplifier (LNA) 131R, a reception mixer 132R, a filter 133R, and an Analog to Digital Converter (ADC) 134R. In the receiver 115R, a reception IF signal is obtained by the transmission RF signal input to the LNA 131R being frequency-converted by the reception mixer 132R and passing through the filter 133R, and a transmission signal is then measured by the ADC 134R performing signal processing on the reception IF signal.

Like the receiver 115R, the receiver 115A and the receiver 115B are constituted by an LNA 131, a reception mixer 132, a filter 133, and an ADC 134. In the receiver 115A, the reflected signal is measured from the transmission RF signal input thereto. In the receiver 115B, the penetrating signal is measured from the transmission RF signal input thereto.

S11 and S21 are represented by the relationship indicated by the following Formulas (1) and (2), and S11 and S21 can therefore be obtained from the measurement results from the receiver 115R, the receiver 115A, and the receiver 115B.

$$S11=\text{Reflection signal/transmission signal} \tag{1}$$

$$S21=\text{Penetrating signal/transmission signal} \tag{2}$$

In the measurement device 10, the transmission RF signal and a reception LO signal, which are high-frequency signals at different frequencies, are generated based on a high-frequency reference clock generated by a single PLL circuit 116.

The PLL circuit 116 generates the high-frequency reference clock and changes the frequency of the LO signal (the LO signal frequency). The LO signal generated based on the high-frequency reference clock is output to each receiver 115 through: the transmission mixer 112; and the buffer 117 and the IQ correction unit 118. Hereinafter, the LO signal used on the transmitting side will be called a "transmission LO signal", and the LO signal used on the receiving side will be called a "reception LO signal".

In the transmission mixer 112, an IF signal from the IF signal generator 111 is mixed with the transmission LO signal to perform frequency conversion, and the transmission RF signal is generated as a result. In addition, in the receiver 115R, the input transmission RF signal is mixed with the reception LO signal input via a buffer 135R by the reception mixer 132R to perform frequency conversion, and the reception IF signal is generated as a result. Like the receiver 115R, in the receiver 115A and the receiver 115B, the input transmission RF signal is mixed with the reception LO signal, and the reception IF signal is generated as a result.

The IQ correction unit 118 is an IQ correction mechanism that corrects IQ error in the LO signal (the reception LO signal). The IQ correction unit 118 is constituted by a Delay Locked Loop (DLL) circuit 141. The DLL circuit 141 is provided with a selector 142. The reception LO signal and the output of the DLL circuit 141 (the reception LO signal after IQ error correction) are input to the selector 142, and one of those signals is output.

In other words, the selector 142 functions as a switching unit (switch), which is a mechanism for switching the IQ correction unit 118 between an on state and an off state. The on state is a state in which IQ error correction is performed by the DLL circuit 141, and the reception LO signal after the IQ error correction is output. The off state is a state in which IQ error correction is not performed by the DLL circuit 141, and the reception LO signal is output as-is.

Figure 2:
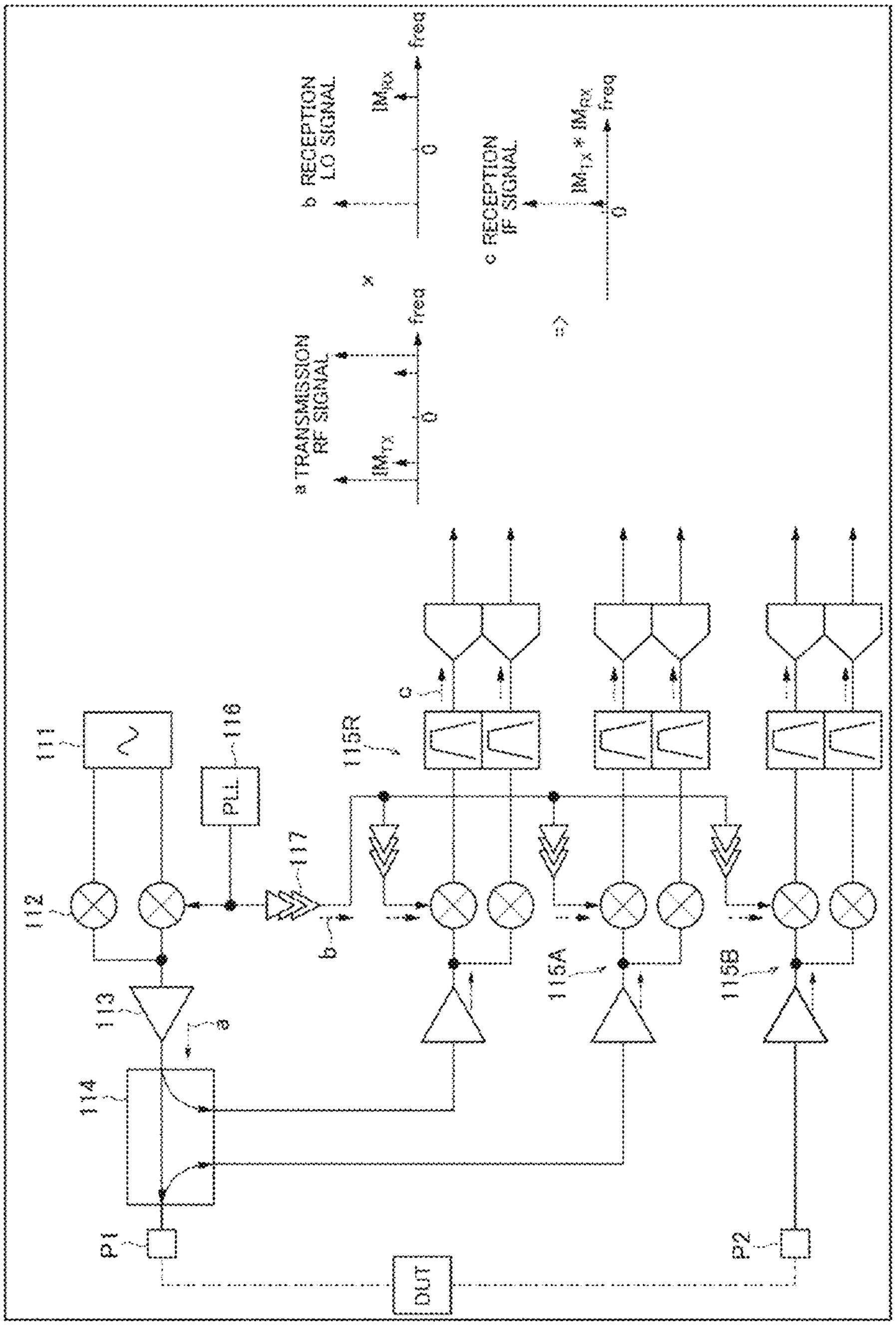
FIG. 2 is a diagram illustrating the effect of an image signal.

In the measurement device 10, providing the IQ correction unit 118 suppresses measurement error caused by the image signal. FIG. 2 is a diagram illustrating the effect of the image signal. To illustrate the effect of the image signal, FIG. 2 illustrates a conventional measurement device configuration, i.e., a configuration in which the IQ correction unit 118 is not provided, as a comparison with the configuration of the measurement device 10 illustrated in FIG. 1.

As illustrated in FIG. 2, in the conventional measurement device, an image signal arises in an RF signal due to IQ error in the high-frequency reference clock generated by the PLL circuit 116, the transmission mixer 112, and the like. In addition, each receiver 115 performs frequency conversion in the reception mixer 132 using the reception LO signal, the image cannot be sufficiently removed due to IQ error in the reception LO signal, the reception mixer 132, and the like, and the image signal therefore has an effect.

As such, the product of an image removal ratio $IM_{TX}$ of the transmission mixer 112 and an image removal ratio $IM_{RX}$ of the reception mixer 132 causes an interference signal of $IM_{TX}*IM_{RX}$ to arise at the same frequency as the desired signal. The interference signal caused by the image signal is difficult to distinguish from the desired signal, and thus the measurement result in each receiver 115 contains error, which in turn produces measurement error in S11 and S21.

On the other hand, providing the IQ correction unit 118 and correcting IQ error in the LO signal (the reception LO signal) makes it possible to suppress measurement error caused by the image signal. In addition, a vector network analyzer requires a relatively broad operating frequency range, and when the vector network analyzer is used to measure propagation delay of the measurement target DUT, there is a need for time-error accuracy. The IQ correction unit 118 is an IQ correction mechanism constituted by the DLL circuit 141, but because the unit is a mechanism that corrects error based on a single cycle, ensuring time-error accuracy at low frequencies tends to be difficult.

Accordingly, in the measurement device 10, by providing the IQ correction unit 118 having the DLL circuit 141, and furthermore providing the selector 142 as a mechanism for switching the IQ correction unit 118 between the on state and the off state in accordance with the LO signal frequency, good time-error accuracy can be ensured from low frequencies to high frequencies.

For example, the selector 142 may switch the IQ correction unit 118 between the on state and the off state in accordance with the LO signal frequency set in the PLL circuit 116, as illustrated in FIG. 3. Specifically, when the LO signal frequency is in a range of 3 GHz to 9 GHz, the IQ correction unit 118 is set to the on state, and when the LO signal frequency is in a range of 1 GHz to 3 GHz, the IQ correction unit 118 is set to the off state.

In FIG. 3, 3 GHz is used as a reference frequency, and the LO signal frequency is higher than 3 GHz or lower than 3 GHZ, such that the on state and the off state can be switched. However, the reference frequency is not limited to 3 GHz. In other words, in a region where the LO signal frequency is lower than the reference frequency, the off state may be set, whereas in a region where the LO signal frequency is higher than the reference frequency, the on state may be set.

<Configuration of DLL Circuit>

Figure 4:
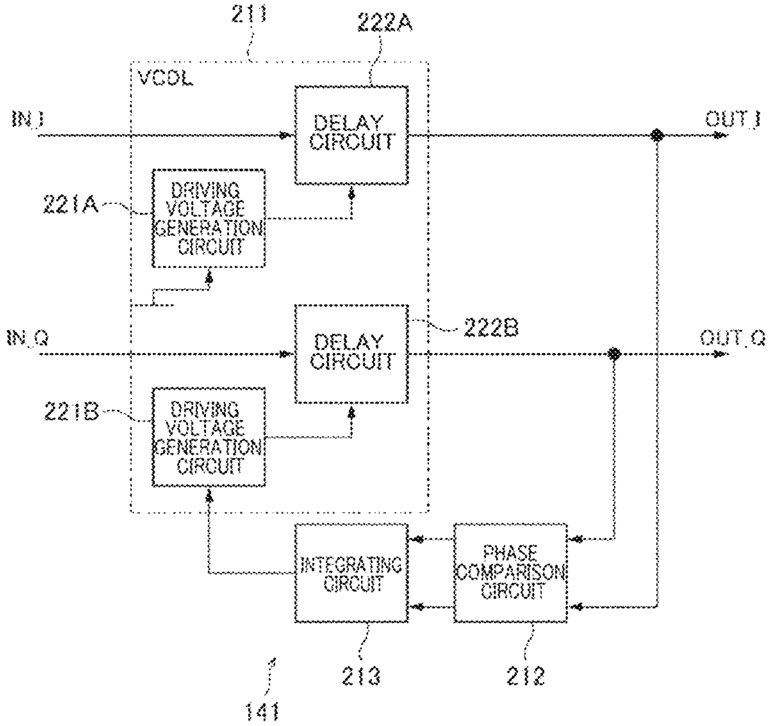
FIG. 4 illustrates an example of the configuration of a DLL circuit constituting an IQ correction unit.

FIG. 4 is a diagram illustrating an example of the configuration of the DLL circuit 141 constituting the IQ correction unit 118 illustrated in FIG. 1.

As illustrated in FIG. 4, the DLL circuit 141 is constituted by a Voltage Controlled Delay Line (VCDL) circuit 211, a phase comparison circuit 212, and an integrating circuit 213. The VCDL circuit 211 includes a driving voltage generation circuit 221A and a delay circuit 222A provided for the I signal, and a driving voltage generation circuit 221B and a delay circuit 222B provided for the Q signal.

The phase comparison circuit 212 compares the phases of an OUT_I signal and an OUT_Q signal, and outputs a comparison result to the integrating circuit 213. The integrating circuit 213 generates a VCDL control signal based on the comparison result from the phase comparison circuit 212, and outputs the VCDL control signal to the VCDL circuit 211. As illustrated in FIG. 4, the VCDL circuit 211 is configured to control the I and Q phase differences by controlling one of the I signal and the Q signal based on the VCDL control signal from the integrating circuit 213.

Figure 5:
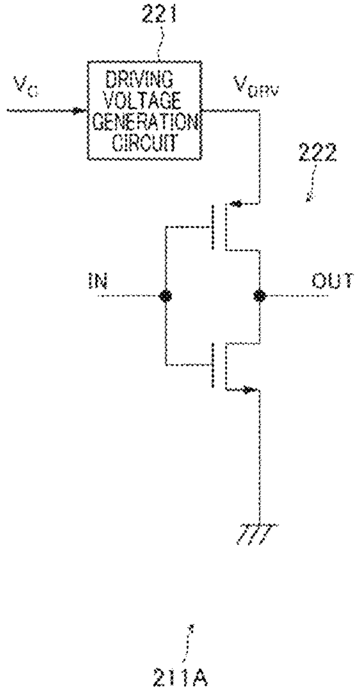
FIG. 5 is a diagram illustrating a first example of the configuration of a VCDL circuit.
Figure 6:
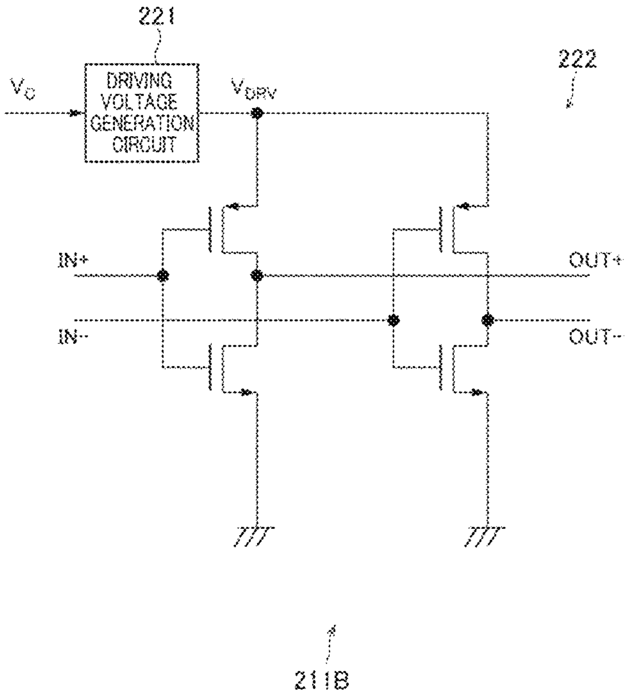
FIG. 6 is a diagram illustrating a second example of the configuration of a VCDL circuit.
Figure 7:
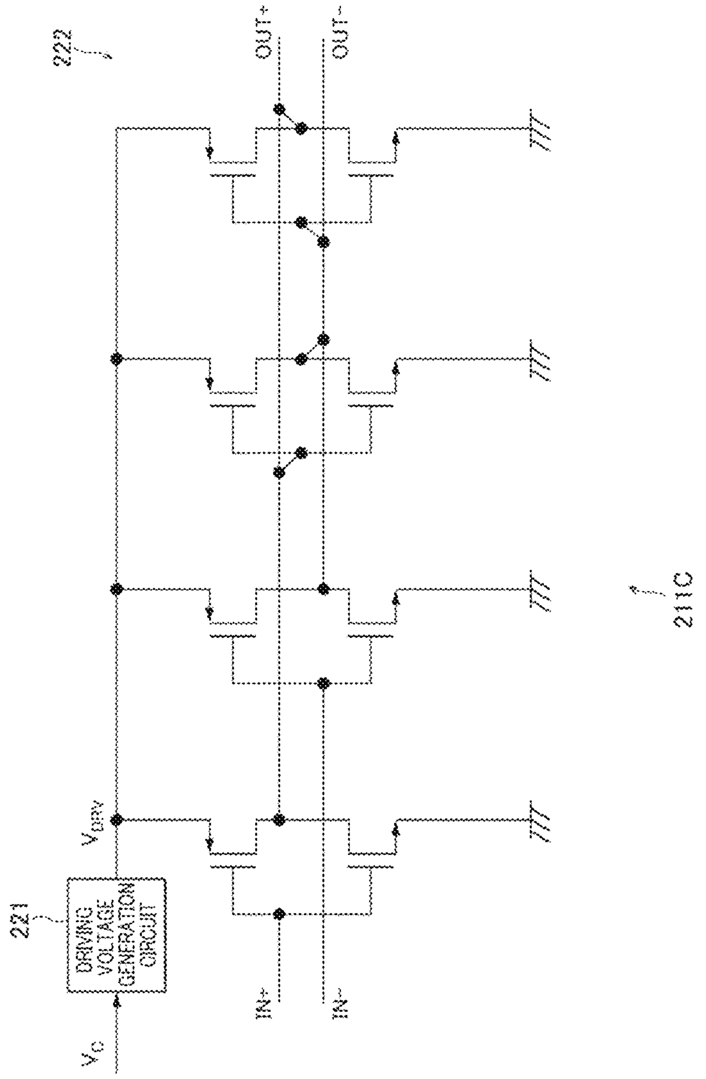
FIG. 7 is a diagram illustrating a third example of the configuration of a VCDL circuit.

FIGS. 5 to 7 are diagrams illustrating examples of the configuration of the VCDL circuit 211 constituting the DLL circuit 141.

As illustrated in FIG. 5, a VCDL circuit 211A includes a driving voltage generation circuit 221 and a delay circuit 222 configured as an inverter. The driving voltage generation circuit 221 generates a driving voltage $V_{DRV}$ based on an input control voltage $V_C$, and outputs the driving voltage $V_{DRV}$ to the inverter serving as the delay circuit 222. Here, the inverter driving voltage is controlled to solve the problems of circuits performing the control of (a) to (d) (described later), but the driving voltage $V_{DRV}$ is generated by the driving voltage generation circuit 221 to increase the control linearity.

Note that in FIG. 5, the inverter serving as the delay circuit 222 is configured in a single stage, but the inverter may be configured over a plurality of stages. In addition, when handling the I signal and the Q signal as differential signals, a VCDL circuit 211B or a VCDL circuit 211C illustrated in FIGS. 6 and 7 can be configured to handle such a case. FIGS. 6 and 7 illustrate only the delay circuit 222 as having only one stage.

Figure 8:
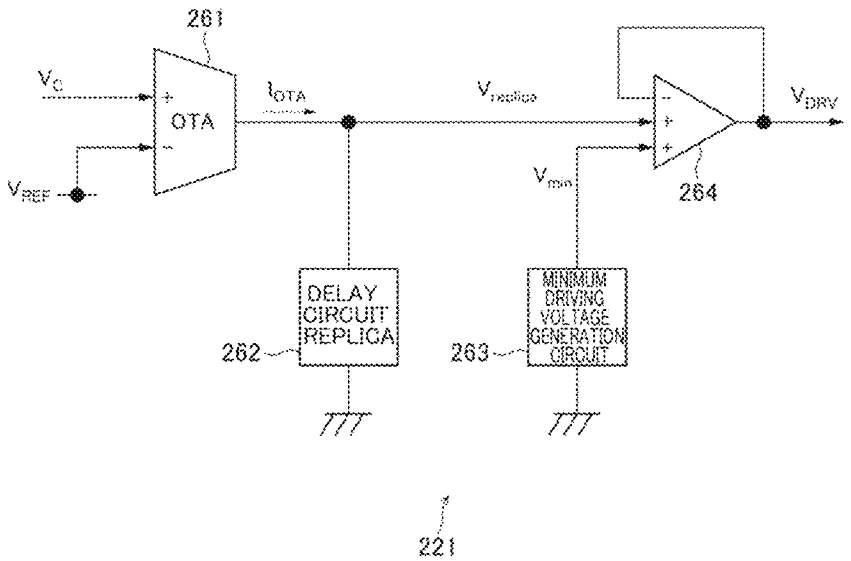
FIG. 8 is a diagram illustrating an example of the configuration of a driving voltage generation circuit constituting a VCDL circuit.
Figure 9:
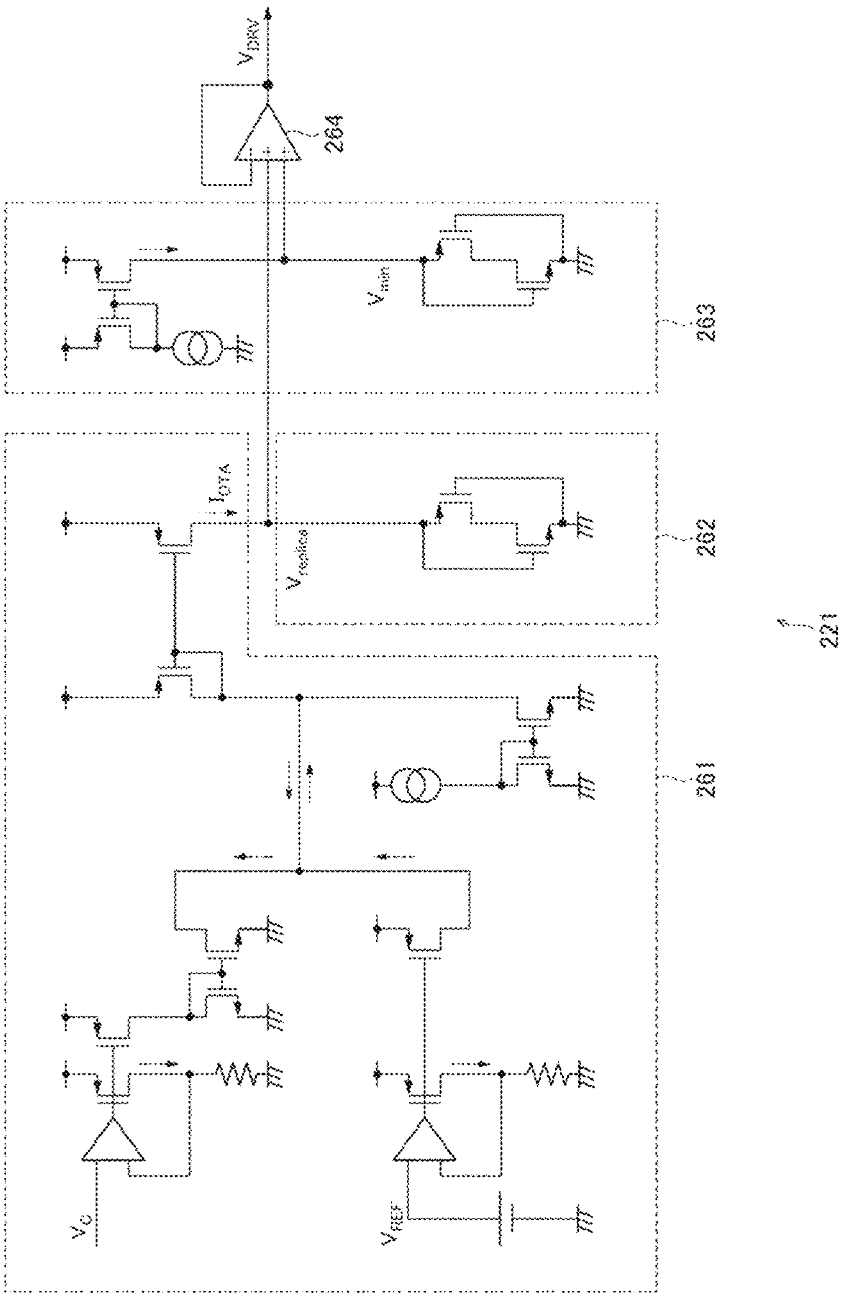
FIG. 9 is a diagram illustrating, in detail, an example of the configuration of a driving voltage generation circuit constituting a VCDL circuit.

FIG. 8 is a diagram illustrating an example of the configuration of the driving voltage generation circuit 221 constituting the VCDL circuit 211. FIG. 9 illustrates, in detail, an example of the configuration of the driving voltage generation circuit 221 illustrated in FIG. 8.

As illustrated in FIG. 8, the driving voltage generation circuit 221 is constituted by an Operational Transconductance Amplifier (OTA) 261, a delay circuit replica 262, a minimum driving voltage generation circuit 263, and a driving amplifier 264.

The control voltage $V_C$ and a reference voltage $V_{REF}$ are input to the OTA 261. The OTA 261 generates a current $I_{OTA}$ proportional to (control voltage $V_C$—reference voltage $V_{REF}$), and converts the result to a voltage $V_{replica}$ using the delay circuit replica 262, which is a replica of the delay circuit 222. The voltage $V_{replica}$ is compared with a voltage $V_{min}$ generated by the minimum driving voltage generation circuit 263, and the higher of those voltages is buffered in the driving amplifier 264 to generate the driving voltage $V_{DRV}$.

This makes it possible for the driving voltage generation circuit 221 to control the on-current of the delay circuit 222. Here, when $V_{replica}>V_{min}$, the delay time of the delay circuit 222 is roughly $t_D\propto 1/I_{OTA}$. At this time, using the delay circuit replica 262 makes it possible to suppress PVT variation. However, due to the relationship of $t_D\propto 1/I_{OTA}$, the delay time is inversely proportional to (control voltage $V_C$—reference voltage $V_{REF}$), and the control linearity is therefore not necessarily good. Accordingly, limiting the driving voltage to a minimum driving voltage using the minimum driving voltage generation circuit 263 makes it possible to improve the control linearity.

<Other Configuration of DLL Circuit>

Figure 10:
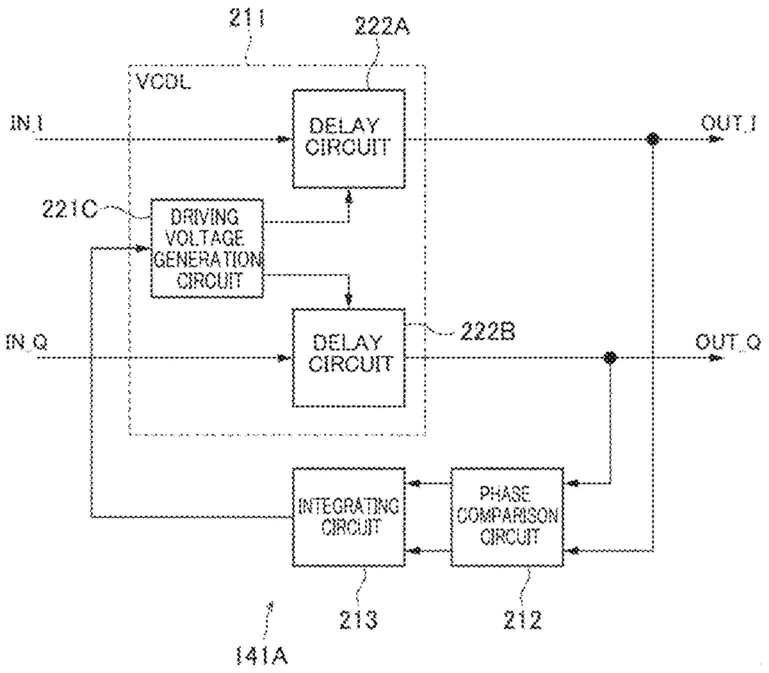
FIG. 10 is a diagram illustrating another example of the configuration of a DLL circuit constituting an IQ correction unit.

The DLL circuit 141 may control a delay difference between the I signal and the Q signal by complementarily controlling (complementary control of) the I signal and the Q signal. FIG. 10 is a diagram illustrating another example of the configuration of the DLL circuit 141 constituting the IQ correction unit 118 illustrated in FIG. 1.

As illustrated in FIG. 10, in a DLL circuit 141A, the VCDL circuit 211 includes a driving voltage generation circuit 221C, the delay circuit 222A, and the delay circuit 222B, and complementarily controls the I signal and the Q signal based on the VCDL control signal from the integrating circuit 213.

Figure 11:
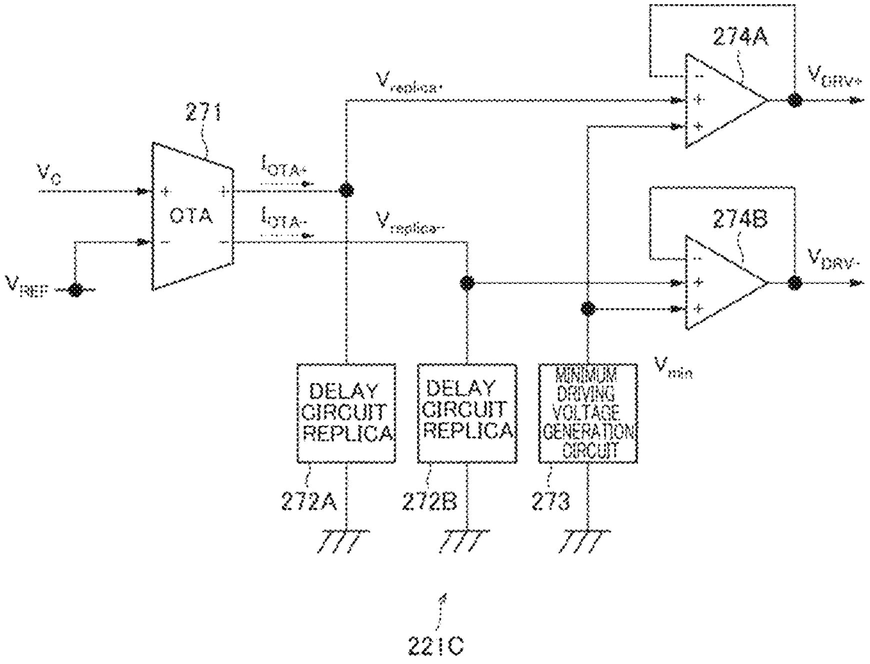
FIG. 11 is a diagram illustrating another example of the configuration of a driving voltage generation circuit constituting a VCDL circuit.
Figure 12:
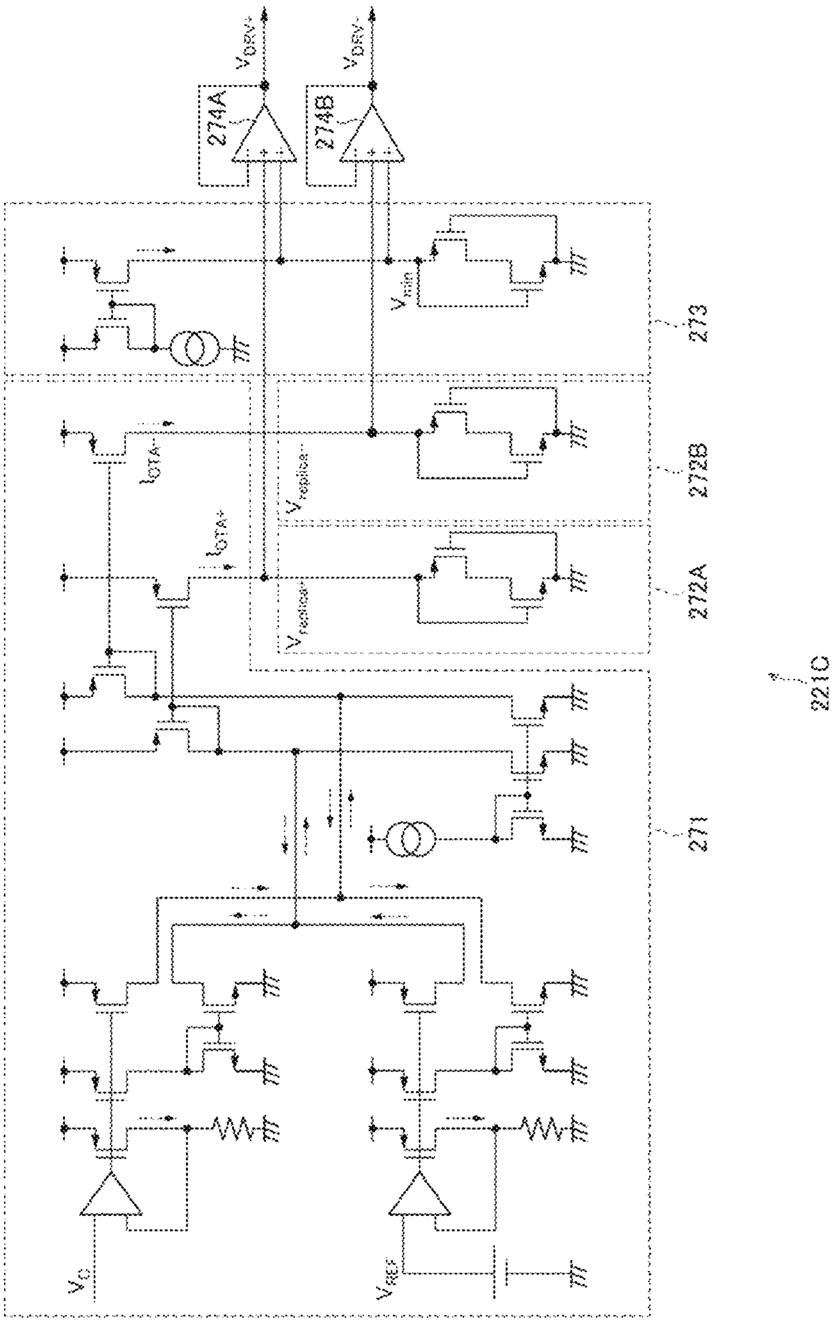
FIG. 12 is a diagram illustrating, in detail, another example of the configuration of a driving voltage generation circuit constituting a VCDL circuit.

FIG. 11 is a diagram illustrating an example of the configuration of the driving voltage generation circuit 221C constituting the VCDL circuit 211 illustrated in FIG. 10. FIG. 12 illustrates, in detail, an example of the configuration of the driving voltage generation circuit 221C illustrated in FIG. 11.

As illustrated in FIG. 11, the driving voltage generation circuit 221C is constituted by an OTA 271, a delay circuit replica 272A, a delay circuit replica 272B, a minimum driving voltage generation circuit 273, a driving amplifier 274A, and a driving amplifier 274B.

The OTA 271 generates a current $I_{OTA+}$ and $I_{OTA+}$ based on the control voltage $V_C$ and the reference voltage $V_{REF}$ input thereto. The current $I_{OTA+}$ is converted to a voltage $V_{replica+}$ using the delay circuit replica 272A, which is a replica of the delay circuit 222A. The voltage $V_{replica+}$ is compared with the voltage $V_{min}$ generated by the minimum driving voltage generation circuit 273, and the higher of those voltages is buffered in the driving amplifier 274A to generate a driving voltage $V_{DRV+}$. On the other hand, the current $I_{OTA-}$ is converted to a voltage $V_{replica-}$ using the delay circuit replica 272B, which is a replica of the delay circuit 222B, the voltage $V_{replica+}$ is compared with the voltage $V_{min}$, and the higher of those voltages is buffered in the driving amplifier 274B to generate a driving voltage $V_{DRV+}$. The driving voltage $V_{DRV+}$ is output to the delay circuit 222A, and the driving voltage $V_{DRV-}$ is output to the delay circuit 222B.

By using the driving voltage $V_{DRV}$ in the VCDL circuit 211 for complementary control, even-order nonlinearity can be cancelled, which makes it possible to achieve higher control linearity. For example, if a delay time $t_D1$ with respect to (control voltage–reference voltage)=V1 represented by Formula (3), taking Formula (4) as a delay time $t_D2$ complementary thereto results in the delay time difference between the two being the value indicated by Formula (5) below, and thus the even-order term of V1 can be cancelled. As a result, $t_D1$-$t_D2$ can be proportional to V1, which makes it possible to achieve high control linearity.

$$t_D1 = a0 + a1 * V1 + a2 * V1^2 \quad (3)$$

$$t_D2 = a0 + a1 * (-V1) + a2 * (-V1)^2 \quad (4)$$

$$t_D1 - t_D2 = 2 * a1 * V1 \quad (5)$$

<Other Configuration of IQ Correction Unit>

Figure 13:
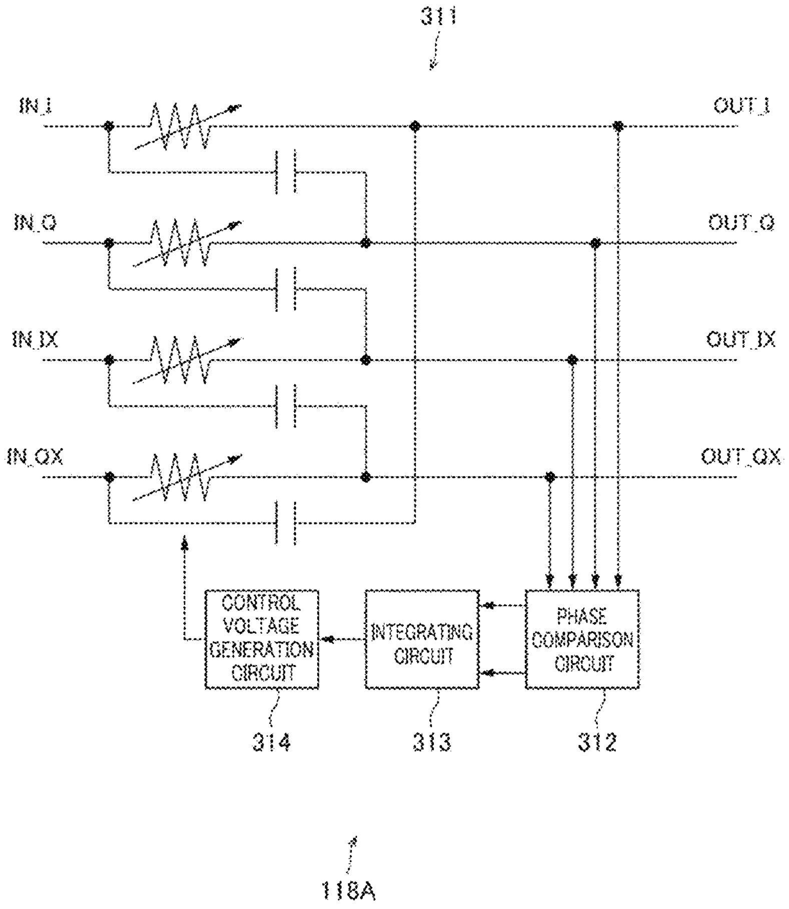
FIG. 13 illustrates another example of the configuration of a DLL circuit constituting an IQ correction unit.

The IQ correction unit 118 is not limited to a DLL circuit, and may be constituted by another circuit, such as, for example, a Poly Phase Filter (PPF) circuit. FIG. 13 is a diagram illustrating another example of the configuration of the IQ correction unit 118 illustrated in FIG. 1.

As illustrated in FIG. 13, an IQ correction unit 118A is constituted by a PPF circuit 311 in which four stages of filters constituted by a resistor and a capacitor are stacked, a phase comparison circuit 312, an integrating circuit 313, and a control voltage generation circuit 314. In the IQ correction unit 118A, the I signal and the Q signal are controlled in response to the PPF circuit 311 operating based on a control voltage from the control voltage generation circuit 314, which makes it possible to correct the IQ error in the LO signal.

<Other Configuration of Switching Unit>

Figure 14A:
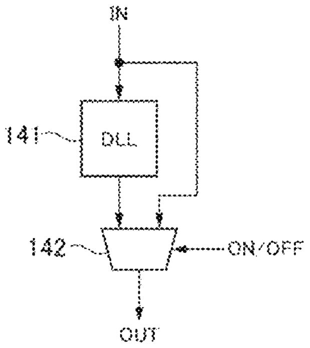
FIGS. 14A and 14B are diagrams illustrating an example the configuration of a switching unit that switches an IQ correction unit on and off.
Figure 14B:
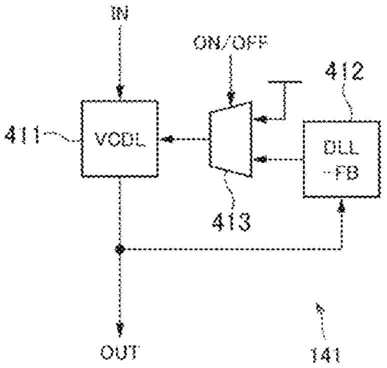

The configuration of the switching unit, which is a mechanism for switching the IQ correction unit 118 having the DLL circuit 141 between the on state and the off state, is not limited to a selector, and another configuration may be used. FIGS. 14A and 14B are diagrams illustrating an example of the configuration of the switching unit.

The configuration illustrated in FIG. 14A corresponds to the configuration in FIG. 1, in which the selector 142 is provided as the switching unit, and the selector 142 switches the IQ correction unit 118 between an on state and an off state in accordance with a signal (an on/off signal) input in accordance with an LO signal frequency set in the PLL circuit 116.

As illustrated in FIG. 14B, the DLL circuit 141 can be effectively put into the off state by configuring the DLL circuit 141 from a VCDL circuit 411, a DLL-FB circuit 412, and a selector 413, and setting the control voltage of the VCDL circuit 411 to a fixed voltage. Through this configuration, the IQ correction unit 118 can be switched between the on state and the off state.

<Configuration of DCDL>

The foregoing has described an example of a configuration of the DLL circuit 141 using the VCDL circuit 211 assuming analog control, but a configuration in which digital control can be realized may be used. Specifically, in the DLL circuit 141, the VCDL circuit 211 can be replaced with a Digital Controlled Delay Line (DCDL) circuit.

Figure 15:
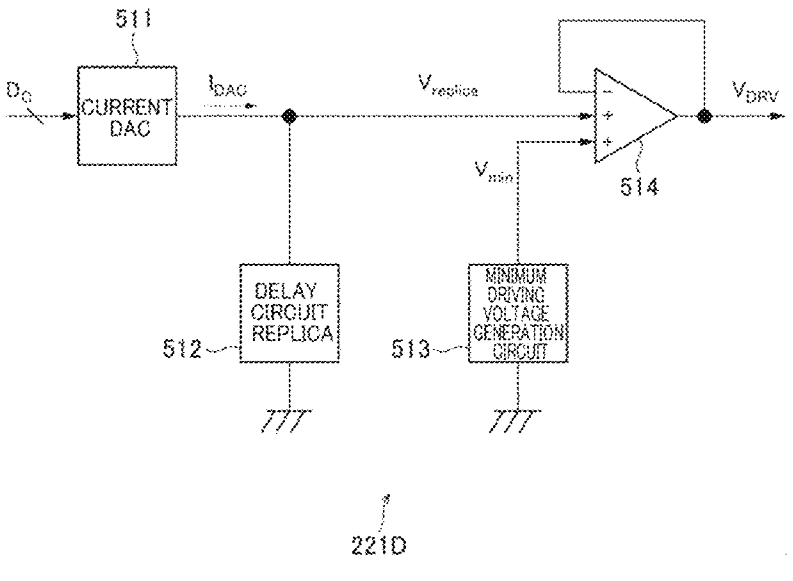
FIG. 15 is a diagram illustrating an example of the configuration of a driving voltage generation circuit constituting a DCDL circuit.

With this DCDL circuit, digital control can be realized, for example, by using a driving voltage generation circuit 221D, illustrated in FIG. 15. As illustrated in FIG. 15, the driving voltage generation circuit 221D is constituted by a current Digital to Analog Converter (DAC) 511, a delay circuit replica 512, a minimum driving voltage generation circuit 513, and a driving amplifier 514.

The current DAC 511 converts a digital control signal Dc input thereto to generate a current $I_{DAC}$, and converts that current to a voltage $V_{replica}$ using the delay circuit replica 512, which is a replica of the delay circuit 222. The voltage $V_{replica}$ is compared with a voltage $V_{min}$ generated by the minimum driving voltage generation circuit 513, and the higher of those voltages can be buffered in the driving amplifier 514 to generate the driving voltage $V_{DRV}$.

When the DLL circuit 141 is configured for digital control, the optimal value for control input of the DCDL circuit can be stored in a memory, and that value can then be used as appropriate. This makes it possible to reduce current consumption by eliminating the need for a feedback circuit to operate continually.

<Other Configuration of Delay Circuit Replica>

Figure 16A:
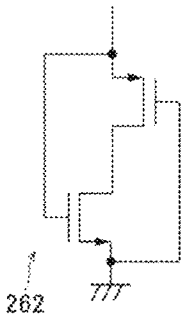
FIGS. 16A, 16B, and 16C are diagrams illustrating an example of the configuration of a delay circuit replica.
Figure 16B:
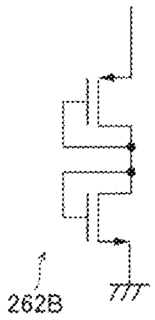
Figure 16C:
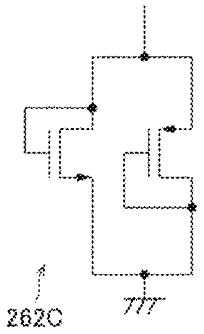

The configuration of the delay circuit replica 262 of the driving voltage generation circuit 221 constituting the VCDL circuit 211 can take on various forms according to the delay circuit 222. FIGS. 16A, 16B, and 16C are diagrams illustrating an example of the configuration of the delay circuit replica 262.

The configuration of the delay circuit replica 262 illustrated in FIG. 16A corresponds to the configuration illustrated in FIG. 9. FIGS. 16B and 16C illustrate a delay circuit replica 262B and a delay circuit replica 262C, which are configurations corresponding to the delay circuit 222, as other configurations of the delay circuit replica 262.

The minimum driving voltage generation circuit 263 of the driving voltage generation circuit 221 constituting the VCDL circuit 211 is preferably constituted by a replica circuit, but can also be constituted by a DAC or the like. At this time, storing the optimal value in a memory when the device is shipped makes it possible to reduce the effects of variation in elements among individual devices, and operate the device at the optimal value.

Although repeated descriptions will not be given, the configurations of the delay circuit replicas 272A and 272B of the driving voltage generation circuit 221C illustrated in FIGS. 11 and 12 are not limited to the configurations illustrated in FIG. 16A, and the configurations illustrated in FIGS. 16B and 16C can be used as well, for example.

<Other Configuration of VNA>

In the measurement device 10 illustrated in FIG. 1, the IQ correction unit 118 is illustrated as being configured to correct the IQ error in the reception LO signal, but the configuration may be a configuration for correcting the IQ error in the transmission LO signal or a configuration for correcting the IQ error in the transmission LO signal and the reception LO signal.

Figure 17:
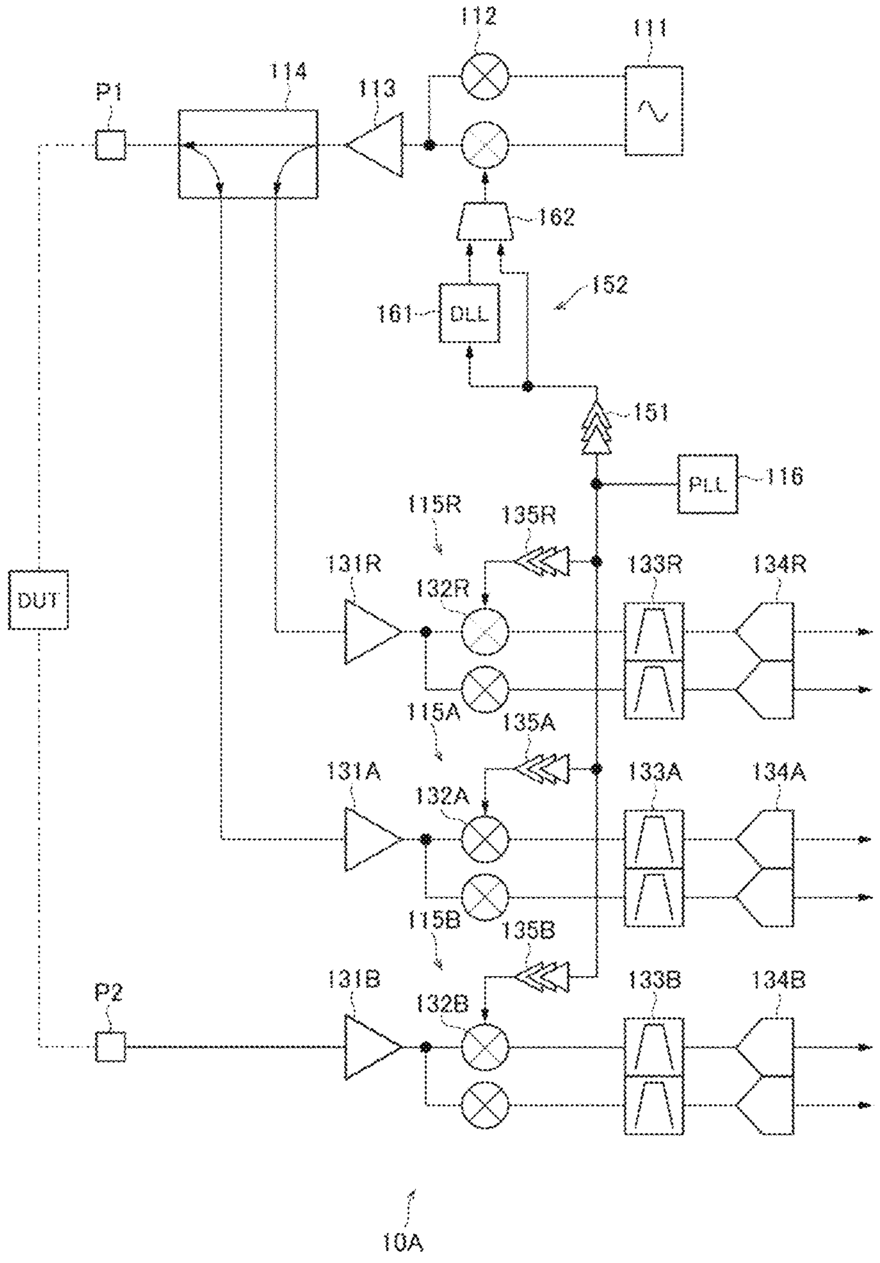
FIG. 17 is a diagram illustrating another example of the configuration of one embodiment of a measurement device to which the present disclosure is applied.

FIG. 17 is a diagram illustrating another example of the configuration of one embodiment of a measurement device to which the present disclosure is applied. Compared to the measurement device 10 illustrated in FIG. 1, in FIG. 17, a measurement device 10A is provided with a buffer 151 and an IQ correction unit 152 instead of the buffer 117 and the IQ correction unit 118.

The IQ correction unit 152 is an IQ correction mechanism that corrects IQ error in the LO signal (the transmission LO signal), and is constituted by a DLL circuit 161. The DLL circuit 161 is provided with a selector 162. The transmission LO signal and the output of the DLL circuit 161 (the transmission LO signal after IQ error correction) are input to the selector 162, and one of those signals is output.

In other words, the selector 162 functions as a switching unit (switch), which is a mechanism for switching the IQ correction unit 152 between an on state and an off state. The on state is a state in which IQ error correction is performed by the DLL circuit 161, and the transmission LO signal after the IQ error correction is output. The off state is a state in which IQ error correction is not performed by the DLL circuit 161, and the transmission LO signal is output as-is.

Figure 18:
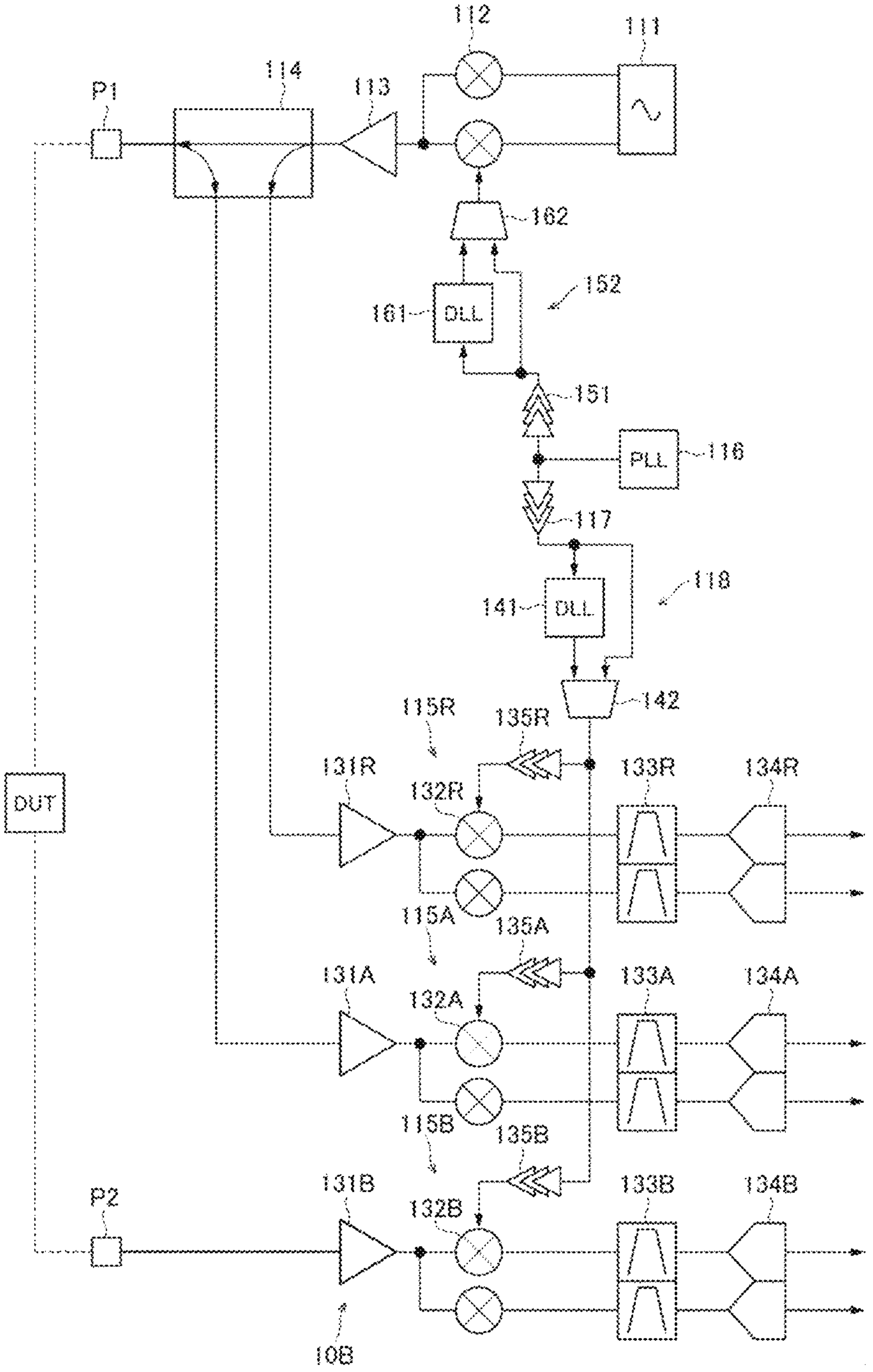
FIG. 18 is a diagram illustrating yet another example of the configuration of one embodiment of a measurement device to which the present disclosure is applied.

FIG. 18 is a diagram illustrating yet another example of the configuration of one embodiment of a measurement device to which the present disclosure is applied. Compared to the measurement device 10 illustrated in FIG. 1 and the measurement device 10A illustrated in FIG. 17, in FIG. 18, a measurement device 10B is provided with the buffer 151 and the IQ correction unit 152 instead of the buffer 117 and the IQ correction unit 118.

Both the IQ correction unit 118 and the IQ correction unit 152 are provided in the measurement device 10B, and thus IQ error correction can be performed on both the reception LO signal and the transmission LO signal. Additionally, the selector 142 is provided for the DLL circuit 141 and the selector 162 is provided for the DLL circuit 161, and thus the IQ correction unit 118 and the IQ correction unit 152 can both be switched between the on state and the off state.

As described above, the measurement device 10 (including the measurement device 10A and the measurement device 10B) to which the present disclosure is applied includes: the PLL circuit 116 used in common to generate both the transmission RF signal and the reception LO signal that are high-frequency signals at different frequencies; the IQ correction unit (at least one of the IQ correction unit 118 or the IQ correction unit 152) that corrects IQ error in an LO signal used to generate at least one of the transmission RF signal or the reception LO signal; and a switching unit (at least one of the selector 142 or the selector 162) that switches between an on state in which correction by the IQ correction unit is performed and an off state in which the correction is not performed.

According to the measurement device 10 to which the present disclosure is applied, having such a configuration makes it possible, for example, for the IQ correction unit 118 and the IQ correction unit 152 to switch between the on state and the off state according to the LO signal frequency, and thus good time-error accuracy can be ensured from low frequencies to high frequencies. As a result, the measurement device 10 can take measurements more accurately when measuring the S parameters of the measurement target DUT.

Here, for example, the following two configurations can be given as examples of configurations for generating a transmission RF signal and a reception LO signal, which are high-frequency signals at different frequencies, in a vector network analyzer. That is, there is a 2-PLL configuration that generates transmission RF signals and reception LO signals using individual PLL circuits, and a 1-PLL configuration that generates either one of the signals through frequency conversion by a mixer using a common PLL circuit. The 1-PLL configuration is disclosed in PTL 1, mentioned above. These two configurations have the following problems.

A 2-PLL configuration requires an LC Voltage Controlled Oscillator (LC-VCO), which has relatively good phase noise characteristics at high frequencies exceeding, for example, 1 GHZ. However, each of the plurality of PLL circuits requires an oscillator using an inductor, and thus magnetic field coupling becomes a problem. A VCO frequency amplifier or the like is necessary to avoid this problem, which increases the power consumption.

In the 1-PLL configuration, the VNA measurement accuracy drops due to an image signal caused by IQ error in the LO signal. The effect is particularly marked when the frequency is high, and in order to suppress a drop the VNA measurement accuracy, measures for reducing relative variations are necessary to reduce the IQ error, which increases the power consumption.

On the other hand, an IQ correction function is used in a general transceiver configuration. For example, the following Document A discloses techniques related to an IQ correction function in a transceiver. Applying these techniques to the 1-PLL configuration in the vector network analyzer makes it possible to implements a 1-PLL configuration+IQ correction mechanism.

Document A: JP 2016-201619A

In a 1-PLL configuration+IQ correction mechanism configuration, an IQ correction mechanism can be provided for either the transmission RF signal or the reception LO signal. However, even in a 1-PLL configuration+IQ correction mechanism configuration, the vector network analyzer generally has a broad operating frequency range, and thus particularly when the frequency of the LO signal is low, the effects of error in the IQ correction mechanism increase, which degrades the characteristics.

For example, circuits that perform the control indicated in the following (a) to (d) can be considered as VCDL circuits used in a DLL circuit.

(a) bias current control using CML
(b) bias current control using an inverter
(c) load capacity control using an inverter
(d) driving voltage control using an inverter These types of control have the following problems. That is, low-voltage operation is difficult with the control (a); and in the control (b), low-voltage operation is good, but high-speed operation is difficult. On the other hand, while the control (c) and (d) offer good low-voltage operation and high-speed operation, the control is difficult to use in DLL circuits that have low control linearity and for which the characteristics are important.

For example, the control (b) is discussed in the following Document B, and the control (d) is discussed in the following Document C.

Document B: JP 2009-5214A
Document C: JP 2009-281888A

As described above, in a 1-PLL configuration+IQ correction mechanism configuration, providing an IQ correction mechanism makes it possible to suppress measurement error caused by an image signal. However, a vector network analyzer requires a relatively broad operating frequency range, and when the vector network analyzer is used to measure propagation delay of the measurement target DUT, there is a need for time-error accuracy. The IQ correction mechanism can be configured using a DLL circuit and the like, but because this is generally a mechanism that corrects error based on the cycle, ensuring time-error accuracy at low frequencies tends to be difficult. In addition, using a circuit that performs the control indicated in (a) to (d) as a VCDL circuit used in the DLL circuit results in the problems described above.

Accordingly, in the measurement device 10 to which the present disclosure is applied, when using a 1-PLL configuration+IQ correction mechanism (IQ correction unit) configuration, the device may be provided with: an IQ correction unit (at least one of the IQ correction unit 118 or the IQ correction unit 152) that corrects IQ error in an LO signal used to generate at least one of a transmission RF signal and a reception LO signal generation, and a switching unit (at least one of the selector 142 or the selector 162) that switches between an on state in which correction by the IQ correction unit is performed and an off state in which correction is not performed. This makes it possible, for example, for the IQ correction unit 118 and the IQ correction unit 152 to switch between the on state and the off state according to the LO signal frequency, and thus good time-error accuracy can be ensured from low frequencies to high frequencies. Measurements can be taken more accurately as a result.

In the measurement device 10 to which the present disclosure is applied, the inverter driving voltage is controlled for the VCDL circuit 211 constituting the DLL circuit 141 of the IQ correction unit 118 (the DLL circuit 161 of the IQ correction unit 152), but the driving voltage $V_{DRV}$ is generated by the driving voltage generation circuit 221 to increase the control linearity, which solves the problems of the circuits performing the control (a) to (d) described above.

<Variations>

Figure 19:
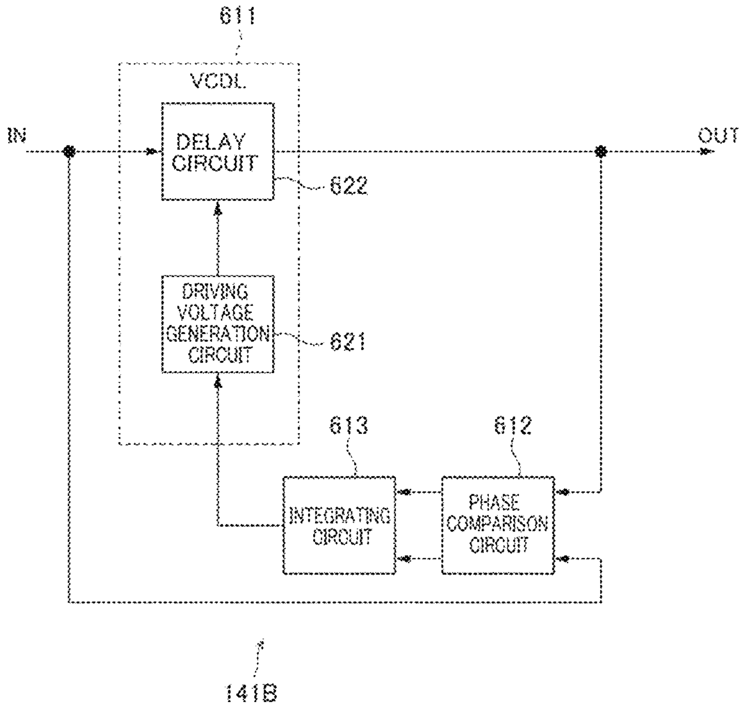
FIG. 19 is a diagram illustrating an example of the application of a DLL circuit.

Although the foregoing described the DLL circuit 141 as being used for IQ error correction in a vector network analyzer, the DLL circuit 141 can also be applied in IQ error correction in a transmission/reception circuit for wireless communication, for example. Alternatively, as illustrated in FIG. 19, the DLL circuit 141 can be used as a DLL circuit for clock skew adjustment. FIG. 19 illustrates a configuration in which clock skew is adjusted by a DLL circuit 141B constituted by a VCDL circuit 611 including a driving voltage generation circuit 621 and a delay circuit 622, a phase comparison circuit 612, and an integrating circuit 613.

Figure 20:
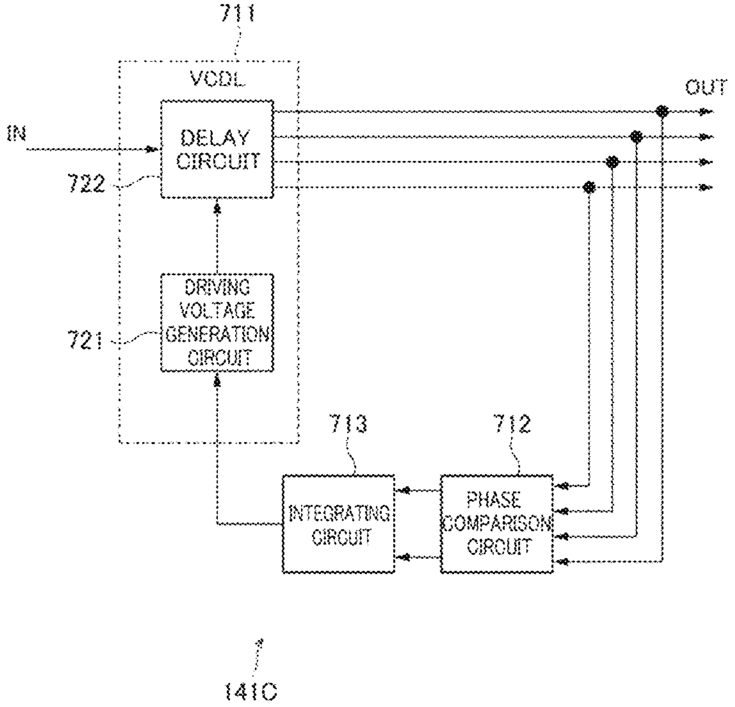
FIG. 20 is a diagram illustrating another example of the application of a DLL circuit.

In addition, as illustrated in FIG. 20, the DLL circuit 141 can be used for timing adjustment in a multiphase clock generation circuit used in wired communication and the like. FIG. 20 illustrates a configuration in which a multiphase clock generation circuit is configured using a DLL circuit 141C constituted by a VCDL circuit 711 including a driving voltage generation circuit 721 and a delay circuit 722, a phase comparison circuit 712, and an integrating circuit 713.

Note that the embodiments of the present disclosure are not limited to the above-described embodiments, and various modifications can be made without departing from the essential spirit of the present disclosure. The effects described in the present specification are merely illustrative and not limiting, and other effects may be obtained.

The present disclosure can also be configured as follows.

(1)

A measurement device including:

a Phase Locked Loop (PLL) circuit used in common to generate both a transmission Radio Frequency (RF) signal and a reception Local Oscillator (LO) signal that are high-frequency signals at different frequencies;

an IQ correction unit that corrects IQ error in an LO signal used to generate at least one of the transmission RF signal or the reception LO signal; and a switching unit that switches between an on state in which correction by the IQ correction unit is performed and an off state in which the correction is not performed.

(2)

The measurement device according to (1), wherein the switching unit switches between the on state and the off state according to an LO signal frequency.

(3)

The measurement device according to (2), wherein the switching unit switches to the off state in a region where the LO signal frequency is lower than a reference frequency, and switches to the on state in a region where the LO signal frequency is higher than the reference frequency.

(4)

The measurement device according to (1), wherein the IQ correction unit includes a Delay Locked Loop (DLL) circuit that corrects the IQ error in the LO signal.

(5)

The measurement device according to (4), wherein the DLL circuit has a Voltage Controlled Delay Line (VCDL) circuit, and the VCDL includes: a driving voltage generation circuit that generates a driving voltage for a delay circuit based on an input control voltage; and the delay circuit.

(6)

The measurement device according to (5), wherein the driving voltage generation circuit includes: an Operational Transconductance Amplifier (OTA) that generates a current proportional to the control voltage; and a replica circuit of the delay circuit, and the driving voltage is generated using the OTA and the replica circuit.

(7)

The measurement device according to (6), wherein the driving voltage generation circuit further includes a minimum driving voltage generation circuit that limits a minimum value of the driving voltage.

(8)

The measurement device according to (4), wherein the DLL circuit includes a VCDL circuit that controls a delay difference between an I signal and a Q signal by complementarily controlling the I signal and the Q signal.

(9)

The measurement device according to (1), wherein the IQ correction unit includes a Poly Phase Filter (PPF) circuit that corrects the IQ error in the LO signal.

(10)

The measurement device according to (3), wherein the switching unit is a selector that, in accordance with an input signal based on the LO signal frequency, switches between and outputs an LO signal that input thereto and corrected by the IQ correction unit and an LO signal that has not been corrected by the IQ correction unit.

(11)

The measurement device according to any one of (1) to (10), wherein the transmission RF signal is generated by frequency conversion performed by a transmission mixer on a transmission Intermediate Frequency (IF) signal, using a transmission LO signal, the measurement device further includes:

a first receiver that receives the transmission RF signal and measures a transmission signal through frequency conversion to a reception IF signal performed by a first reception mixer using the reception LO signal;

a second receiver that receives a part of the transmission RF signal reflected by a measurement target and measures a reflected signal through frequency conversion to a reception IF signal performed by a second reception mixer using the reception LO signal; and a third receiver that receives a part of the transmission RF signal penetrating the measurement target and measures a penetrating signal through frequency conversion to a reception IF signal performed by a third reception mixer using the reception LO signal, wherein the measurement device is configured as a vector network analyzer capable of measuring an S parameter of the measurement target using the transmission signal, the reflected signal, and the penetrating signal.

REFERENCE SIGNS LIST

10, 10A, 10B Measurement device
111 IF signal generator
112 Transmission mixer
113 Transmission amplifier
114 Directional coupler
115R, 115A, 115B Receiver
116 PLL circuit
117 Buffer
118 IQ correction unit
131 LNA
132 Reception mixer
133 Filter
134 ADC
135 Buffer
141 DLL circuit
142 Selector
151 Buffer
152 IQ correction unit
161 DLL circuit
162 Selector
211 VCDL circuit
212 Phase comparison circuit
213 Integrating circuit
221 Driving voltage generation circuit
222 Delay circuit
261, 271 OTA
262, 272 Delay circuit replica
263, 273 Minimum driving voltage generation circuit
264, 274 Driving amplifier
311 PPF circuit
312 Phase comparison circuit
313 Integrating circuit
314 Control voltage generation circuit
411 VCDL circuit
412 DLL-FB circuit
413 Selector
511 Current DAC
512 Delay circuit replica
513 Minimum driving voltage generation circuit
514 Driving amplifier

The invention claimed is:

1. A measurement device comprising:

a Phase Locked Loop (PLL) circuit used in common to generate both a transmission Radio Frequency (RF) signal and a reception Local Oscillator (LO) signal that are high-frequency signals at different frequencies;

an IQ correction unit that corrects IQ error in an LO signal used to generate at least one of the transmission RF signal or the reception LO signal; and a switching unit that switches between an on state in which correction by the IQ correction unit is performed and an off state in which the correction is not performed.

2. The measurement device according to claim 1, wherein the switching unit switches between the on state and the off state according to an LO signal frequency.

3. The measurement device according to claim 2, wherein the switching unit switches to the off state in a region where the LO signal frequency is lower than a reference frequency, and switches to the on state in a region where the LO signal frequency is higher than the reference frequency.

4. The measurement device according to claim 1, wherein the IQ correction unit includes a Delay Locked Loop (DLL) circuit that corrects the IQ error in the LO signal.

5. The measurement device according to claim 4, wherein the DLL circuit has a Voltage Controlled Delay Line (VCDL) circuit, and the VCDL circuit includes: a driving voltage generation circuit that generates a driving voltage for a delay circuit based on an input control voltage; and the delay circuit.

6. The measurement device according to claim 5, wherein the driving voltage generation circuit includes: an Operational Transconductance Amplifier (OTA) that generates a current proportional to the control voltage; and a replica circuit of the delay circuit, and the driving voltage is generated using the OTA and the replica circuit.

7. The measurement device according to claim 6, wherein the driving voltage generation circuit further includes a minimum driving voltage generation circuit that limits a minimum value of the driving voltage.

8. The measurement device according to claim 4, wherein the DLL circuit includes a VCDL circuit that controls a delay difference between an I signal and a Q signal by complementarily controlling the I signal and the Q signal.

9. The measurement device according to claim 1, wherein the IQ correction unit includes a Poly Phase Filter (PPF) circuit that corrects the IQ error in the LO signal.

10. The measurement device according to claim 3, wherein the switching unit is a selector that, in accordance with an input signal based on the LO signal frequency, switches between and outputs an LO signal that input thereto and corrected by the IQ correction unit and an LO signal that has not been corrected by the IQ correction unit.

11. The measurement device according to claim 1, wherein the transmission RF signal is generated by frequency conversion performed by a transmission mixer on a transmission Intermediate Frequency (IF) signal, using a transmission LO signal, the measurement device further comprises:

a first receiver that receives the transmission RF signal and measures a transmission signal through frequency conversion to a reception IF signal performed by a first reception mixer using the reception LO signal;

a second receiver that receives a part of the transmission RF signal reflected by a measurement target and measures a reflected signal through frequency conversion to a reception IF signal performed by a second reception mixer using the reception LO signal; and a third receiver that receives a part of the transmission RF signal penetrating the measurement target and measures a penetrating signal through frequency conversion to a reception IF signal performed by a third reception mixer using the reception LO signal, wherein the measurement device is configured as a vector network analyzer capable of measuring an S parameter of the measurement target using the transmission signal, the reflected signal, and the penetrating signal.

* * * * *